(12) United States Patent
Kwak et al.

(10) Patent No.: US 6,772,359 B2
(45) Date of Patent: Aug. 3, 2004

(54) CLOCK CONTROL CIRCUIT FOR RAMBUS DRAM

(75) Inventors: Jong Tae Kwak, Kyoungki-do (KR); Dong Woo Shin, Kyoungki-do (KR); Jong Sup Baek, Kyoungki-do (KR); Choul Hee Koo, Kyoungki-do (KR); Nak Kyu Park, Kyoungki-do (KR)

(73) Assignee: Hyundai Electronics Industries Co., Ltd., Ichon (KR)

( * ) Notice: Subject to any disclaimer, the term of this patent is extended or adjusted under 35 U.S.C. 154(b) by 513 days.

(21) Appl. No.: 09/725,896

(22) Filed: Nov. 30, 2000

(65) Prior Publication Data

US 2001/0042220 A1 Nov. 15, 2001

(30) Foreign Application Priority Data

Nov. 30, 1999 (KR) ............................................ 99-53896

(51) Int. Cl.[7] ................................................ G06F 1/04
(52) U.S. Cl. ........................ 713/500; 713/322; 713/600
(58) Field of Search ................................ 713/320, 322, 713/400, 401, 500, 501, 503, 600

(56) References Cited

U.S. PATENT DOCUMENTS 5,845,108 A  * 12/1998 Yoo et al. .................... 713/400
5,857,095 A  * 1/1999 Jeddeloh et al. ............. 713/401
6,378,018 B1 * 4/2002 Tsern et al. .................. 710/313
6,553,449 B1 * 4/2003 Dodd et al. ...................... 711/5

* cited by examiner

Primary Examiner—Dennis M. Butler
(74) Attorney, Agent, or Firm—Pillsbury Winthrop LLP

(57) ABSTRACT

A clock control circuit for a Rambus DRAM is provided which reduces power consumption by determining in advance whether an applied command is a read or current control command, and enabling a clock signal for externally outputting an internal data only during the read or current control command. Our circuit includes: an input signal detecting unit for generating an enable signal when one of a first comparing signal comparing an address value of the selected Rambus DRAM with a device address value of a COLC packet, and a second comparing signal comparing the address value of the selected Rambus DRAM with a device address value of a COLX packet is enabled, and when the command is a read or current control command; a signal generating unit for generating a clock enable signal for externally outputting an internal data when one of the first and second comparing signals is enabled; an output signal maintaining unit for outputting a control signal for maintaining the clock enable signal to the signal generating unit in the read or current control command; and an output signal control unit for outputting a control signal for controlling generation of the clock enable signal to the signal generating unit, when the command is not the read or current control command.

4 Claims, 5 Drawing Sheets

CLOCK CONTROL CIRCUIT FOR RAMBUS DRAM

BACKGROUND OF THE INVENTION

1. Field of the Invention

The present invention relates in general to a clock control circuit for a Rambus dynamic random access memory (DRAM). More particularly, it provides an improved clock control circuit for a Rambus DRAM which reduces power consumption by generating a clock signal for externally outputting an internal data only in a read or current control command.

2. Description of Related Art

In general, a Rambus DRAM is a packet driving memory device for transmitting packet type data and control signals. A plurality of Rambus DRAMs are connected on a Rambus channel. Each Rambus DRAM is controlled by a Rambus memory controller through the Rambus channel.

A command packet in the Rambus DRAM is divided into a primary control packet(PCP) and a secondary control packet(SCP). The SCP includes various commands such as a read command and a current control command. When the read or current control command is applied to the Rambus DRAM, an internal clock signal tclk is enabled and used to externally output an internal data.

Conventionally, whenever the SCP is applied, the clock signal tclk is enabled. When it is judged by command decoding that an applied command signal is not a read or current control command, the clock signal tclk is disabled. If the command signal is the read or current control command, the clock signal tclk is maintained as it is. Accordingly, a large volume of SCPs are applied, and many unnecessary clock signals are generated when the SCP command is not a read or current control command. These unnecessary clock signals cause wasted power consumption. The operation and disadvantages of a conventional clock control circuit will now be explained with reference to the accompanying drawings.

As illustrated in FIG. 1 (Prior Art) and FIG. 2 (Prior Art), the SCP type in the command application method for the Rambus DRAM is divided into a COLC packet (FIG. 1) and a COLX packet (FIG. 2).

As shown therein, the SCP is synchronized with a CFM clock, and thus the command is applied consecutively through five pins COL0, COL1, . . . , COL4.

In the COLC packet (FIG. 1), DC[4:0] denotes a device address where the command will be performed, and COP[3:0] denotes a command OP_code(here, OP_code implies a command code performed by a device). In addition, BC[3:0] denotes a bank address, and C[5:0] denotes a column address.

In the COLX packet (FIG. 2), DX[4:0] denotes a device address, and XOP[4:0] denotes a command OP_code. BX[3:0] denotes a bank address.

According to COP[3:0] of the COLC packet, various commands including the read, write and precharge operations can be performed. According to XOP[4:0] of the COLX packet, the current control and precharge operations can be performed.

The COLC packet and the COLX packet can be combined and applied at the same time. In this case, the SCP can simultaneously apply a command to two devices.

FIG. 3 (Prior Art) is a schematic diagram of a conventional circuit for generating a clock enable signal tclk_en, which, in turn, generates the clock signal tclk. An input signal detecting unit 10 receives a signal idhit_cas_ffl indicating whether a value of DC[4:0] is identical to its address and a signal idhit_cas_othr indicating whether a value of DX[4:0] is identical to its device address, and for enabling an output signal etck_en when at least one signal is enabled. An output signal maintaining unit 20 generates a control signal ten_in1_b for maintaining an enable state of the clock enable signal tclk_en outputted in the read or current control command. An output signal control unit 30 receives the output signal etck_en from the input signal detecting unit 10, and generates a control signal ten_in2_b for disabling the output signal tclk_en when the command is not the read or current control command. A signal generating unit 40 receives the signal idhit_cas_ffl, the signal idhit_cas_othr, the output signal ten_in1_b from the input signal detecting unit 20, and the output signal ten_in2_b from the output signal control unit 30, and generates the clock enable signal tclk_en.

When the command is applied with the SCP command packet on a Rambus DRAM module (maximally 32 devices), the respective Rambus DRAMs on the module compare DC[4:0] and DX[4:0] with their device addresses. Each Rambus DRAM converts the signal idhit_cas_ffl to a high level when the value of DC[4:0] is identical to their device addresses, and converts the signal idhit_cas_othr to a high level when the value of DX[4:0] is identical to their device addresses.

In the conventional circuit for generating the clock enable signal tclk_en, when one of the signals idhit_cas_ffl, idhit_cas_othr is at a high level, the output signal tclk_en from a NAND gate NA3 of the signal generating unit 40 becomes a high level, thereby generating the clock signal tclk. In addition, the output signal etck_en from a NAND gate NA1 of the input signal detecting unit 10 also becomes a high level, and thus an enable terminal EN of a flip-flop FF4 which is a latch circuit becomes a high level. Accordingly, the output signal ten_in2_b from a flip-flop FF4 is at a low level. Therefore, if not set through a set terminal S(Q=1), the output signal tclk_en from the NAND gate NA3 is maintained at a high level.

When the output signal ten_in1_b from the output signal maintaining unit 20 generated due to a special command(not the read or current control command) is at a high level, the output signal ten_in2_b from the flip-flop FF4 of the output signal control unit 30 is set after three cycles(the signal etck_en is consecutively transmitted, and thus the signal etck_en_rst becomes '1'), thereby converting a high value of the clock enable signal tclk_en to a low level.

That is, when a sequence of applying a command to one of the 32 devices on the module with one of the COLC and COLX packets is consecutively carried out, toggling of the unnecessary clock signal tclk occurs in three cycles in the device identical to the device address value of the other packet(value of DC[4:0] of the COLC packet or DX[4:0] of the COLX packet).

For example, when the 32 Rambus DRAMs are on the module, if the read command(COP=0011) is externally applied to the $10^{th}$ device (DC=01010) with the COLC packet, the value of the COPX packet is generally 'DX=00000' and 'XOP=00000'. In this case, since the value of DX is '0', the signal idhit_cas_othr informing that the device ID is matched in the $0^{th}$ device becomes a high level. Accordingly, toggling of the clock signal tclk occurs in the $0^{th}$ device as well as the $10^{th}$ device. Thereafter, since the value of XOP is '0', the clock signal tclk is disabled after three cycles.

FIG. 4 (Prior Art) shows an operation timing of a COL packet of the Rambus DRAM. When the signal idhit_cas_othr(h) becomes a high level by applying the command with the COLX packet, the clock enable signal tclk_en(d) becomes a high level, and thus a clock signal tclka(e) and a clock signal tclkb(f) are operated, thereby generating a pulse. However, when it is judged that the command is not the read or current control command, the clock enable signal tclk_en(d) is disabled after three cycles, thereby controlling generation of the clock signals tclka, tclkb(e)(f).

In the conventional Rambus DRAM, when the SCP command is applied, the internal clock enable signal tclk_en becomes a high level, and thus the clock signal tclk is enabled. Thereafter, according to the command analysis, if the applied command is not the read or current control command, the clock enable signal tclk_en is disabled after three cycles. As a result, toggling of the clock signal tclk unnecessarily occurs in the three cycles, which results in large power consumption.

SUMMARY OF THE INVENTION

The present invention provides a clock control circuit for a Rambus DRAM which reduces power consumption by judging in advance whether an applied command is a read or current control command, and enabling a clock signal for externally outputting an internal data only if the applied command is a read or current control command.

An input signal detecting unit generates an enable signal when one a first and second comparing signals is enabled. The first comparing signal compares an address value of the selected Rambus DRAM with an applied device address value of a COLC packet. The second comparing signal compares the address value of the selected Rambus DRAM with an applied device address value of a COLX packet. When the applied command is a read or current control command, the command is applied with an SCP command packet on a Rambus DRAM module. A signal generating unit generates a clock enable signal for externally outputting an internal data when one of the first and second comparing signals is enabled. An output signal maintaining unit outputs to the signal generating unit a control signal for maintaining the clock enable signal from the signal generating unit in the read or current control command. An output signal control unit outputs to the signal generating unit a control signal for controlling generation of the clock enable signal from the signal generating unit, when the command applied according to the enable signal outputted from the input signal detecting unit is not the read or current control command.

The input signal detecting unit includes: a first NAND gate for receiving a COP[1] signal(rqin2<1>signal) which is a bit implying the read or current control command in COP[3:0] which is an op_code of the COLC packet, and the first comparing signal; a second NAND gate for receiving a COP[1] signal(rqin3<3>signal) which is a bit implying the read or current control command in COP[3:0] which is an op_code of the COLX packet, and the second comparing signal; and an OR gate for receiving an inverted signal of the output signal from the first NAND gate and an inverted signal of the output signal from the second NAND gate.

The output signal control unit includes: a first flip-flop for receiving the enable signal from the input signal detecting unit as an input signal, and a clock signal as a clock input; a second flip-flop for receiving an inverted signal of the output signal from the first flip-flop as an input signal, and the clock signal as a clock input; a third flip-flop for receiving the output signal from the second flip-flop as an input signal, and the clock signal as a clock input; an OR gate for receiving an inverted signal of the output signal from the third flip-flop and an inverted signal of a reset bar signal; and a fourth flip-flop for receiving the output signal from the input signal detecting unit as an enable signal, the output signal from the OR gate as a set signal, and a ground voltage as an input signal, and outputting an output signal to the signal generating unit.

The signal generating unit includes: an OR gate for receiving an inverted signal of the first comparing signal, an inverted signal of the second comparing signal, an inverted signal of the output signal from the output signal control unit, and an inverted signal of the output signal from the output signal maintaining unit, and for generating the clock enable signal tclk_en.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION

Figure 1:
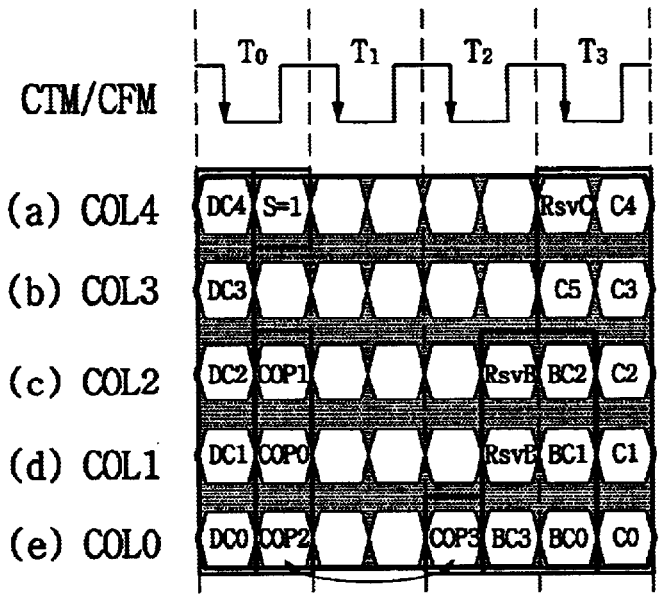
FIG. 1 (Prior Art) is a schematic diagram illustrating a COLC packet of a conventional Rambus DRAM.
Figure 2:
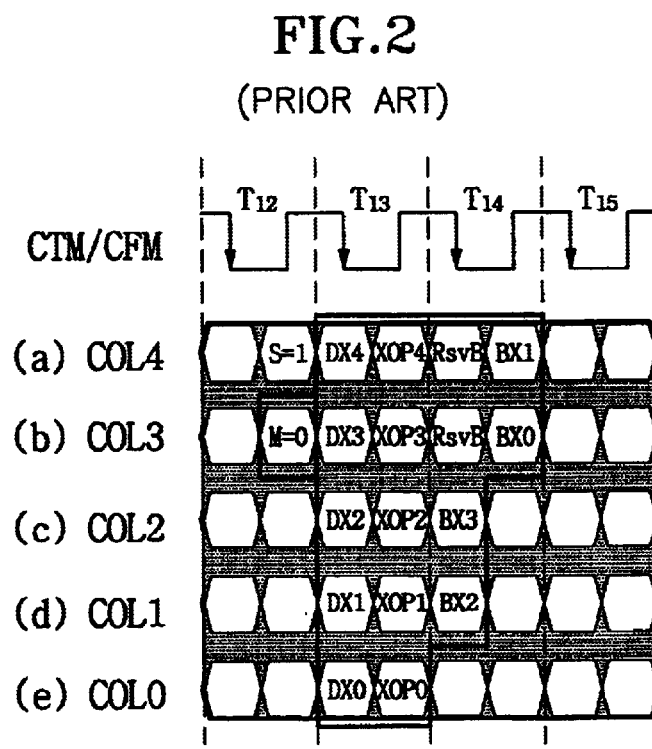
FIG. 2 (Prior Art) is a schematic diagram illustrating a COLX packet of a conventional Rambus DRAM.
Figure 3:
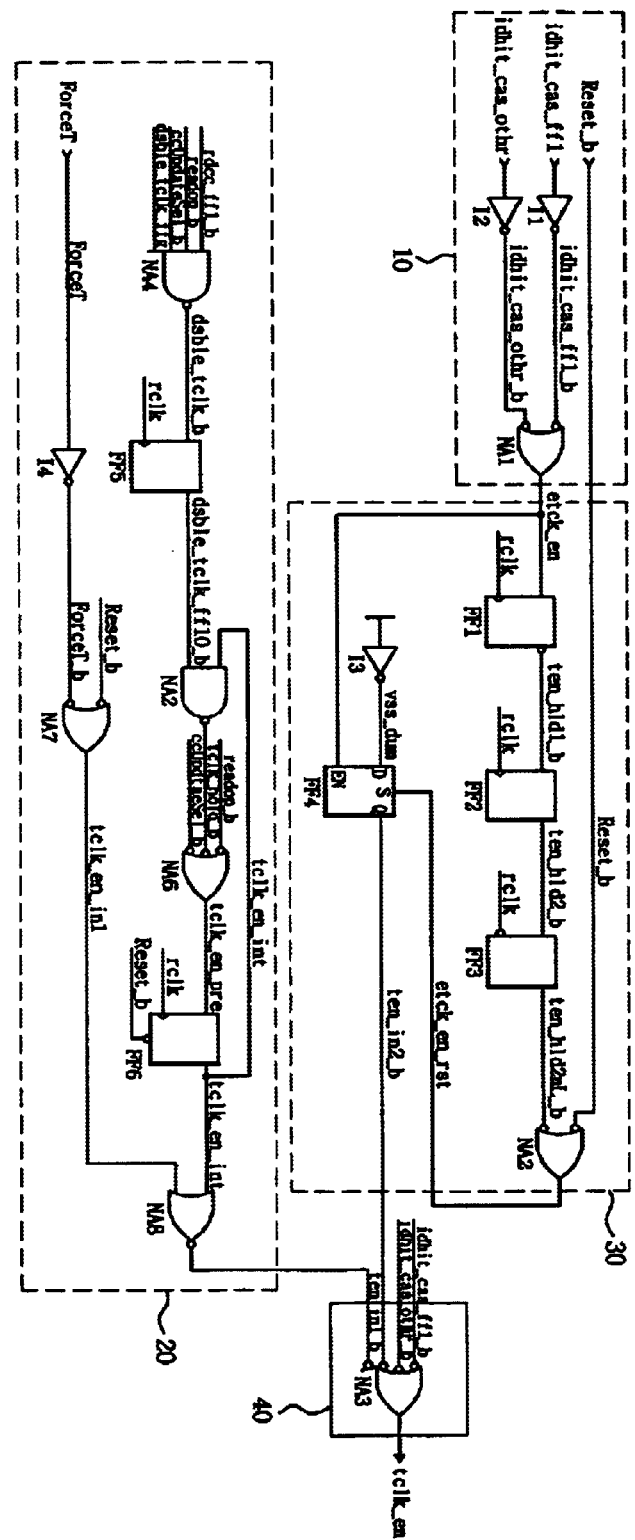
FIG. 3 (Prior Art) is a schematic diagram showing a conventional circuit for generating a clock enable signal.
Figure 4:
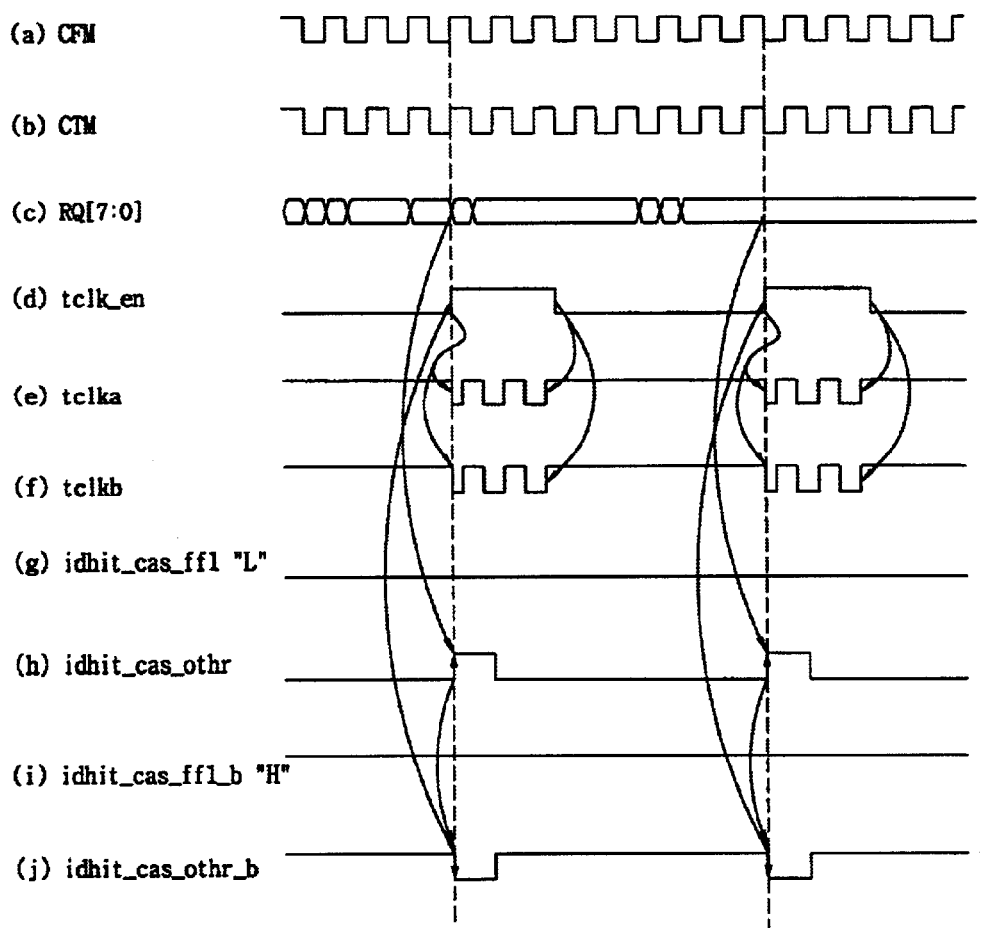
FIG. 4 (Prior Art)is an operation timing view of a COL packet in the conventional Rambus DRAM.

A clock control circuit for a Rambus DRAM in accordance with the present invention will now be described in detail with reference to the accompanying drawings.

In the drawings, elements having an identical function are provided with the identical reference numeral, and repeated explanations thereof will be omitted.

Figure 5:
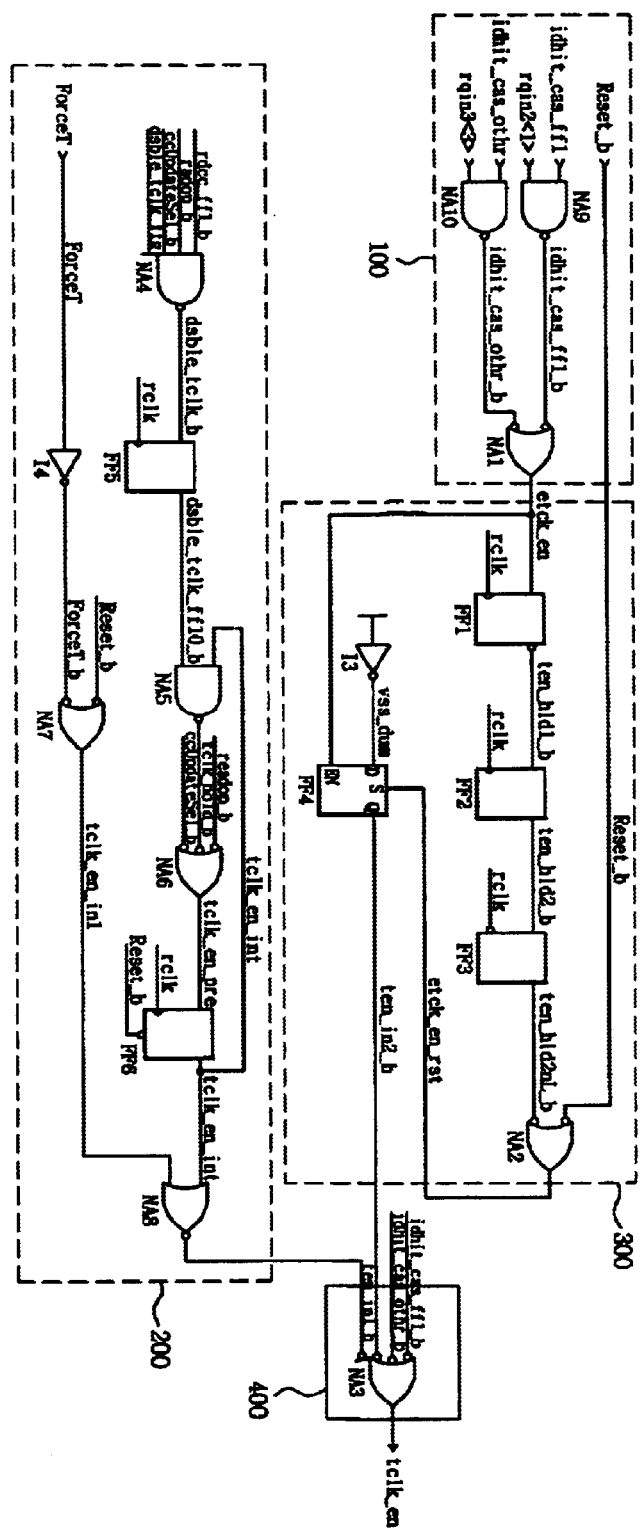
FIG. 5 illustrates a circuit for generating a clock enable signal for the Rambus DRAM in accordance with the present invention.

FIG. 5 is a schematic diagram of a circuit for generating a clock enable signal tclk_en for the Rambus DRAM in accordance with the present invention. An input signal detecting unit 100 causes an output signal etck_en to go to a high level when one of the input signals idhit_cas_ffl, idhit_cas_othr is at a high level in a read or current control command. An output signal maintaining unit 200 maintains the enabled output signal tclk_en when an applied command is a read or current control command. An output signal control unit 300 receives the output signal etck_en from the input signal detecting unit 100, and generates a control signal for disabling the output signal tclk_en when the command is not a read or current control command. A signal generating unit 400 receives the signal idhit_cas_ffl, the signal idhit_cas_othr, the output signal ten_in1_b from the output signal maintaining unit 200, and the output signal ten_in2_b from the output signal control unit 300, and generates the clock enable signal tclk_en only in the read or current control command.

The input signal detecting unit 100 includes: a NAND gate NA9 for receiving a COP[1] signal(rqin2<1>signal) which is a bit implying the read or current control command in COP[3:0] which is an op_code of the COLC packet, and the signal idhit_cas_ffl, and for generating a low logic signal when the signal idhit_cas_ffl is at a high level in the read or current control command(when rqin2<1>signal is at a high level); a NAND gate NA10 for receiving a COP[1] signal(rqin3<3>signal) which is a bit implying the read or current control command in COP[3:0] which is an op_code of the COLX packet, and the signal idhit_cas_othr, and for generating a low logic signal when the signal idhit_cas_othr is at a high level in the read or current control command (when rqin3<3>signal is at a high level); and an OR gate for outputting a high logic signal etck_en when one of the output signals from the NAND gates NA9, NA10 is at a low level.

In the read or current control command, the output signal maintaining unit 200 outputs a low signal to the signal generating unit 400 so that the output signal tclk_en from the signal generating unit 400 can be maintained at a high level.

The output signal control unit 300 includes: a flip-flop FF1 for receiving the output signal etck_en from the input signal detecting unit 100 as an input signal, and a clock signal rclk as a clock input; a flip-flop FF2 for receiving an inverted signal ten_hld1_b of the output signal from the flip-flop FF1, and the clock signal rclk as a clock input; a flip-flop FF3 for receiving the output signal ten_hld2_b from the flip-flop FF2 as an input signal, and the clock signal rclk as a clock input; an OR gate NA2 for receiving an inverted signal of the output signal ten_hld2nL_b from the flip-flop FF3 and an inverted signal of a reset bar signal Reset_b; and a flip-flop FF4 for receiving the output signal etck_en from the input signal detecting unit 100 as an enable signal, the output signal etck_en_rst from the OR gate NA2 as a set signal, and a ground voltage Vss_dum as an input signal, and for outputting an output signal ten_in2_b to an OR gate NA3 of the signal generating unit 400.

In addition, the signal generating unit 400 includes an OR gate NA3 for receiving an inverted signal of the signal idhit_cas_ffl_b, an inverted signal of the signal idhit_othr_b, an inverted signal of the output signal ten_in2_b from the output signal control unit 300, and an inverted signal of the output signal ten_in1_b from the output signal maintaining unit 200, and for generating the clock enable signal tclk_en.

When the command is applied with the SCP command packet on a Rambus DRAM module(maximally 32 devices), the respective Rambus DRAMs on the module compare DC[4:0] and DX[4:0] with their device addresses. Each Rambus DRAM converts the signal idhit_cas_ffl to a high level when the value of DC[4:0] is identical to their device addresses, and converts the signal idhit_cas_othr to a high level when the value of DX[4:0] is identical to their device addresses.

When the signal idhit_cas_ffl is at a high level and the signal rqin2<1> implying the read command is also at a high level, the output signal from the NAND gate NA9 becomes a low level, and thus the output signal etck_en from the OR gate NA1 becomes a high level, regardless of the output signal from the NAND gate NA10 for receiving the signal idhit_cas_othr and the signal rqin3<3> implying the current control command, thereby generating the clock enable signal tclk_en. Here, when the signal rqin2<1> implying the read command is at a low level, the NAND gate NA9 outputs a high level signal regardless of the state of the signal idhit_cas_ffl. Accordingly, the output signal etck_en from the OR gate NA1 becomes a low level, and thus the clock enable signal tclk_en is not generated.

In addition, when the signal idhit_cas_othr is at a high level and the signal rqin3<3> implying the current control command is also at a high level, the output signal from the NAND gate NA10 becomes a low level, and thus the output signal etck_en from the OR gate NA1 becomes a high level, regardless of the output signal from the NAND gate NA9 for receiving the signal idhit_cas_ffl and the signal rqin2<1> implying the read command, thereby generating the clock enable signal tclk_en. Here, when the signal rqin3<3> implying the current control command is at a low level, the NAND gate NA10 outputs a high level signal regardless of the state of the signal idhit_cas_othr. Therefore, the output signal etck_en from the OR gate NA1 becomes a low level, and thus the clock enable signal tclk_en is not generated.

When the signal idhit_cas_ffl is at a high level in the read command, and when the signal idhit_cas_othr is at a high level in the current control command, the clock enable signal tclk_en is converted into a high level, thereby generating the clock signal tclk. When the command is not the read or current control command, even if one of the signals idhit_cas_ffl, idhit_cas_othr becomes a high level, the clock enable signal tclk_en is converted into a low level, thereby restricting generation of the clock signal tclk.

Figure 6:
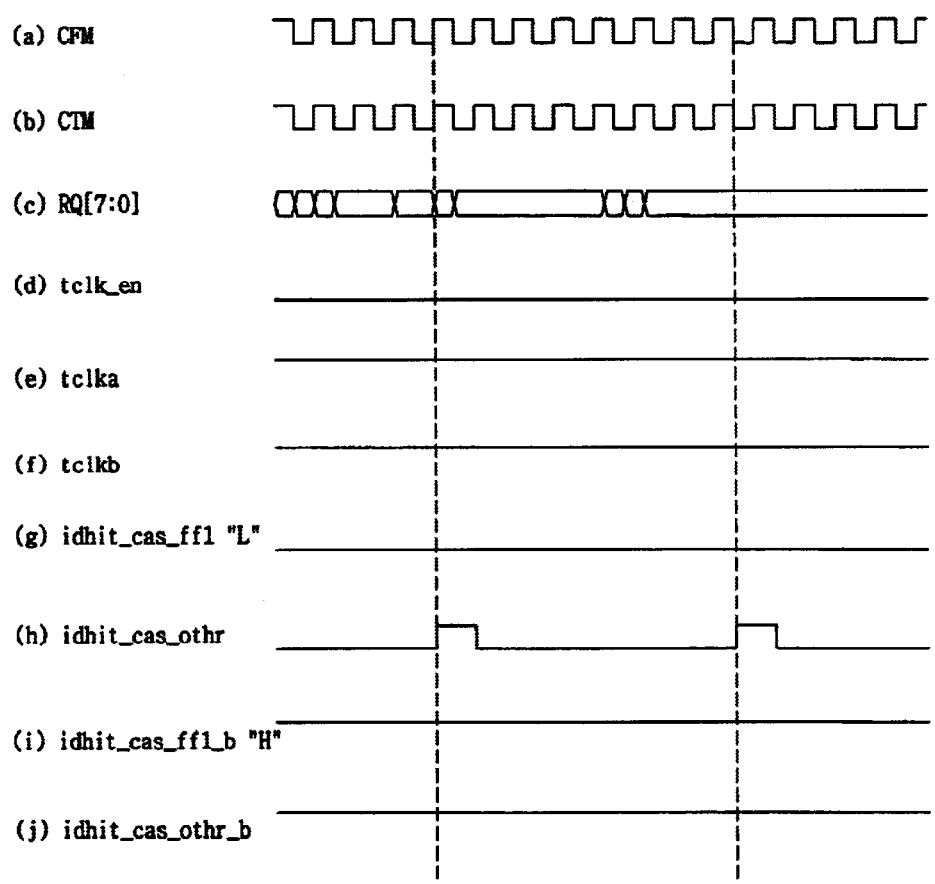
FIG. 6 is a timing diagram of a COL packet in the Rambus DRAM in accordance with the present invention.

FIG. 6 is a timing diagram illustrating operation of a COL packet in the Rambus DRAM in accordance with the present invention.

The signal idhit_cas_othr(h) becomes a high level by the COLX packet. However, the bits rqin2<1>, rqin3<3> implying the read or current command are at a low level, and thus the signal idhit_cas_othr_b(j) cannot be a low level. Accordingly, the clock enable signal tclk_en(d) is constantly at a low level.

Although not illustrated in FIG. 6, if the read or current control command is applied, the clock enable signal tclk_en becomes a high level, and thus the clock signal tclk is normally operated. As a result, unnecessary toggling of the clock signal tclk is not generated, thereby reducing power consumption.

As discussed earlier, the clock control circuit for the Rambus DRAM in accordance with the present invention is embodied by a method for NANDing the COP[1] signal (rqin2<1>signal) implying the read command in COP[3:0] that is an op_code of the COLC packet, and the signal idhit_cas_ffl, and for converting the clock enable signal tclk_en to a high level when the output becomes a low level, and a method for NANDing the XOP[3] signal (rqin3<3>signal) implying the current control command in XOP[4:0] that is an op_code of the COLX packet and the signal idhit_cas_othr, and converting the clock enable signal tclk_en to a high level when the output becomes a low level. As a result, when the command is not the read or current control command, the clock signal tclk is not enabled, which results in reduced power consumption.

The present invention may be embodied in various alternative forms without departing from the spirit or essential characteristics described with respect to the preferred embodiments. Therefore, it should also be understood that the above-described embodiment is not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A clock control circuit for a Rambus DRAM, comprising:

an input signal detecting unit for generating an enable signal when one of a first comparing signal comparing an address value of the selected Rambus DRAM with an applied device address value of a COLC packet, and a second comparing signal comparing the address value of the selected Rambus DRAM with an applied device address value of a COLX packet is enabled, and when the applied command is a read or a current control command, the command being applied with an SCP command packet on a Rambus DRAM module;

a signal generating unit for generating a clock enable signal for externally outputting an internal data when one of the first and second comparing signals is enabled;

an output signal maintaining unit for outputting to the signal generating unit a control signal for maintaining the clock enable signal generated from the signal generating unit in the read or the current control command; and an output signal control unit for outputting to the signal generating unit a control signal for controlling generation of the clock enable signal from the signal generating unit, when the command applied according to the enable signal from the input signal detecting unit is not the read or the current control command;

wherein the COLC packet and the COLX packet include the read command or the current control command.

2. The clock control circuit according to claim 1, wherein the input signal detecting unit comprises:

a first NAND gate for receiving a COP[1]signal (rqin2<1>signal) which is a bit implying the read or current control command in COP[3:0] which is an op_code of the COLC packet, and the first comparing signal;

a second NAND gate for receiving a COP[1] signal (rqin3<3>signal) which is a bit implying the read or current control command in COP[3:0] which is an op_code of the COLX packet, and the second comparing signal; and an OR gate for receiving an inverted signal of the output signal from the first NAND gate and an inverted signal of the output signal from the second NAND gate.

3. The clock control circuit according to claim 1, wherein the output signal control unit comprises:

a first flip-flop for receiving the enable signal from the input signal detecting unit as an input signal, and a clock signal as a clock input;

a second flip-flop for receiving an inverted signal of the output signal from the first flip-flop as an input signal, and the clock signal as a clock input;

a third flip-flop for receiving the output signal from the second flip-flop as an input signal, and the clock signal as a clock input;

an OR gate for receiving an inverted signal of the output signal from the third flip-flop and an inverted signal of a reset bar signal; and a fourth flip-flop for receiving the output signal from the input signal detecting unit as an enable signal, the output signal from the OR gate as a set signal, and a ground voltage as an input signal, and for outputting an output signal to the signal generating unit.

4. The clock control circuit according to claim 1, wherein the signal generating unit comprises an OR gate for receiving an inverted signal of the first comparing signal, an inverted signal of the second comparing signal, an inverted signal of the output signal from the output signal control unit, and an inverted signal of the output signal from the output signal maintaining unit, and for generating the clock enable signal tclk_en.

* * * * *